United States Patent [19]

Hunt

[11] 3,792,384

[45] Feb. 12, 1974

[54] CONTROLLED LOSS CAPACITOR

[75] Inventor: Richard E. Hunt, Tempe, Ariz.

[73] Assignee: Motorola, Inc., Franklin Park, Ill.

[22] Filed: Jan. 25, 1972

[21] Appl. No.: 220,066

[52] U.S. Cl. .......................... 333/84 M, 317/235 AT

[51] Int. Cl. .......................... H01p 3/00, H01p 3/08

[58] Field of Search ..... 333/84 M; 317/235 AT, 235

[56] References Cited

UNITED STATES PATENTS

| | | | |
|---|---|---|---|
| 3,699,646 | 10/1972 | Vadasz | 317/235 |
| 3,576,478 | 4/1971 | Watkins | 317/235 |
| 3,577,181 | 5/1971 | Belohoubek | 317/235 |
| 3,432,792 | 3/1969 | Hatcher, Jr. | 317/235 |
| 3,008,089 | 11/1961 | Uhlir, Jr. | 333/84 M |
| 3,445,793 | 5/1969 | Biard | 333/84 M |
| 3,475,700 | 10/1969 | Ertel | 333/84 M |
| 3,432,778 | 3/1969 | Ertel | 333/84 M |
| 3,429,029 | 2/1969 | Langdon et al. | 333/84 M |

*Primary Examiner*—James W. Lawrence
*Assistant Examiner*—Saxfield Chatmon, Jr.
*Attorney, Agent, or Firm*—Vincent J. Rauner; Henry T. Olsen

[57] ABSTRACT

A variable loss transmission line including conductive strips of polycrystalline silicon deposited on a substrate. The polycrystalline silicon is selectively doped with an impurity to vary the resistance of the strips, thereby varying the loss or attenuation characteristics of the transmission line.

3 Claims, 2 Drawing Figures

CONTROLLED LOSS CAPACITOR

BACKGROUND

This invention relates generally to distributed parameter circuit elements, and more particularly to transmission lines used in high frequency integrated circuits.

There are many applications wherein it is necessary to provide an integrated circuit transmission line having a predetermined loss or attenuation characteristic. One such application for such a transmission line is in a coupling network between two high frequency amplifier stages. Another application is in an antenna matching network between a radio frequency amplifier and an antenna.

Several techniques for providing distributed parameter integrated circuit elements having predetermined loss characteristics are known. One such system utilizes conductive paths comprising multiple layers of metal such as chromium, silver and gold deposited over a silicon dioxide insulating layer. A predetermined loss or attenuation is introduced through the use of a metal film of material such as nichrome used in conjunction with the chromium, silver and gold films.

Whereas this technique provides a way to achieve a distributed parameter circuit element having a predetermined attenuation characteristic, the processing required to deposit the multiple layers of various metals was time-consuming and costly.

SUMMARY

It is an object of the present invention to provide an improved distributed parameter circuit element having controllable loss or attenuation.

It is a further object of this invention to provide a distributed parameter circuit element for use with integrated circuits.

It is another object of this invention to provide a distributed parameter circuit element that can be mass-produced using semiconductor technology.

A still further object of the invention is to provide a distributed parameter circuit element that can be uniformly manufactured at low cost.

Still another object of the invention is to provide a distributed parameter circuit element that can be manufactured using a reduced number of process steps.

In accordance with a preferred embodiment of the invention, a conductive strip of polycrystalline semiconductor material such as, for example, silicon is deposited on a suitable substrate. The polycrystalline semiconductor material is selectively doped, during deposition or by subsequent diffusion, with an impurity to vary the electrical resistance of the strip. When the polycrystalline material is heavily doped, it will have a low resistivity thereby providing a low loss or low attenuation line. A low attenuation line may be used an an inductor or a capacitor, depending on its length. Light doping of the polycrystalline material provides a resistive, high loss line which may be used as a resistor. The polycrystalline semiconductor material can be doped to a wide range of resistivities in a controllable manner to yield distributed parameter circuit elements having a wide range of attenuation characteristics.

DETAILED DESCRIPTION

Figure 1:
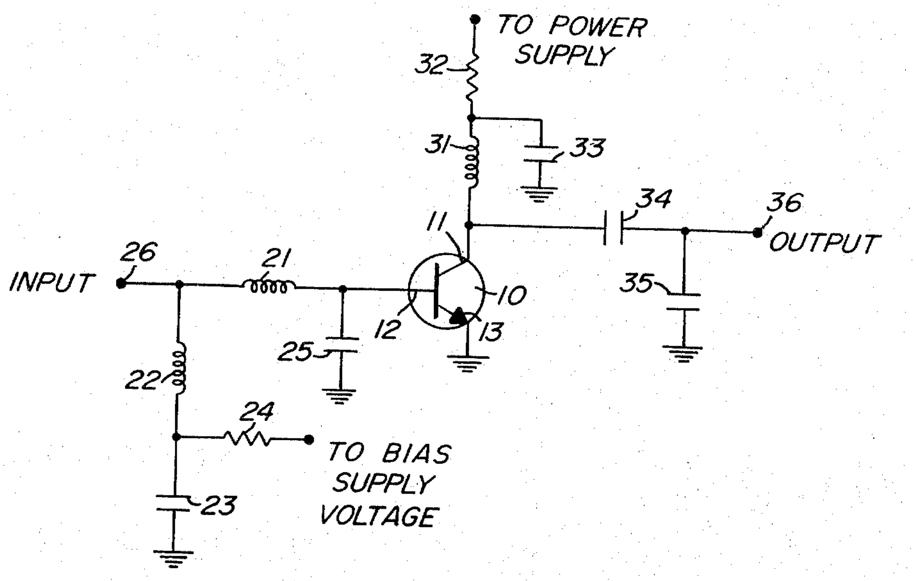
FIG. 1 is a schematic circuit diagram of a radio frequency amplifier including input and output matching networks.

Referring to FIG. 1 showing a radio frequency amplifier having input and output matching networks, a base 12 of a transistor 10 is connected to an input matching network comprising a pair of inductors 21 and 22 and a capacitor 25. One plate of capacitor 25 is connected to base 12 of transistor 10 and the other plate is connected to ground. One end of inductor 21 is connected to base 12 and the other end is connected to an input point 26. Inductor 22 and a capacitor 23 are connected in series between input point 26 and ground, while resistor 24 is connected between the junction of inductor 22 and capacitor 23 and a bias supply voltage. A collector 11 of transistor 10 is connected to a power supply through an inductor 31 and a resistor 32. A bypass capacitor 33 is connected between the junction of resistor 31 and inductor 32 and ground. Collector 11 is also connected to one plate of a capacitor 34, the other plate of capacitor 34 being connected to an output 36. A capacitor 35 is connected between output 36 and ground to complete the output matching network. An emitter 13 of transistor 10 is connected to ground to complete the circuit for transistor 10.

In operation, DC voltage for powering transistor 10 is applied to collector 11 through resistor 32 and inductor 31. Similarly, a bias voltage is applied to base 12 of transistor 10 through resistor 24, inductor 22 and inductor 21. Bypass capacitors 23 and 33 provide a low impedance circuit to ground for radio frequency signals.

A signal from a radio frequency signal source (not shown) having a predetermined output impedance, is applied to input point 26. The input matching network comprising inductors 21, 22 and capacitor 25 transforms the output impedance of the signal source so that it matches the input impedance of transistor 10 for maximum power transfer of the signal from point 26 to base 12. Similarly, the output matching network comprising inductor 31 and capacitors 34 and 35 matches the output impedance of transistor 10 to that of a load (not shown) attached to output point 36.

Figure 2:
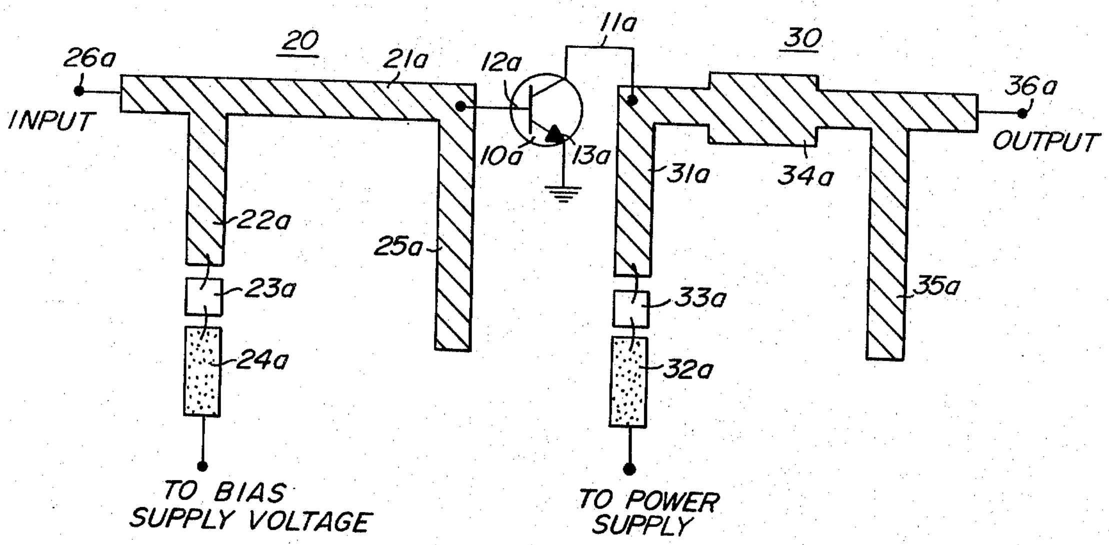
FIG. 2 is a diagram of the matching networks of FIG. 1 constructed according to the invention.

Referring to FIG. 2, there is shown an integrated circuit version of the circuit of FIG. 1 having matching networks utilizing circuit elements constructed according to the invention. A transmission line network 20 comprising three transmission lines **21*a*, 22*a* and 25*a* is made of heavily doped polycrystalline silicon deposited on a non-conductive substrate to provide a low resistance, low loss, network. The doping may be accomplished either prior to deposition or in a subsequent diffusion step. Transmission line network 20 comprises an input line 21*a*, and lines 22*a* and 25*a* connected near opposite ends of line 21*a*. Line 22*a* operates as a short circuited stub and line 25*a* operates as an open circuited stub. The lengths of lines 21*a*, 22*a* and 25*a* are adjusted to provide the inductive and capacitive reactances necessary to provide the desired impedance match for transistor 10*a*. Specific lengths for the various lines are given in the discussion that follows. The junction of lines 21*a* and 25*a* is connected to a base 12*a* of a transistor 10*a*. A similar network 30 comprising lines 31***a*, 34*a* and 35*a* is connected to a collector 11*a* of transistor 10*a*. Line 22*a* of transmission line network 20 is connected to a bypass capacitor 23*a* and a bias resistor 24*a*. The other plate (not shown) of capacitor 23*a* is connected to a ground point such as a conductive layer on the opposite surface of the substrate, and the other terminal of resistor 24*a* is connected to a bias supply. Similarly, line 31*a* of network 30 is connected to a bypass capacitor 33*a* and a bias resistor 32*a*. The other plate (not shown) of capacitor 33*a* is connected to a ground point, and the other end of bias resistor 32*a* is connected to the power supply. An emitter 13*a* of transistor 10*a* is connected to ground to complete the circuit.

Bias resistor 24*a* is made of lightly doped polycrystalline silicon, or other semiconductor material having a relatively high resistivity compared to the heavily doped material used to construct transmission line network 20. A bias voltage is applied from the bias source through resistor 24*a*, line 22*a* and line 21*a* to base 12*a* of transistor 10*a*. Resistor 24*a* and lines 22*a* and 21*a* are analogous to resistor 24 and inductors 22 and 21, respectively, of FIG. 1. Bypass capacitor 23*a* serves as a low impedance to ground at radio frequencies, thereby isolating the bias supply from the base 12*a* of transistor 10*a*. Capacitor 23*a* also terminates line 22*a* in a short circuit.

Since line 22*a* is terminated in substantially a short circuit, (capacitor 23*a*) its length is chosen to be less than one quarter wavelength at the frequency of operation. This makes line 22*a* appear inductive as desired. Line 25*a* is also less than one quarter wavelength long, but since it is terminated in an open circuit, it appears capacitive as desired. The length of line 21*a* is chosen so that it appears inductive when terminated by base 12*a* of transistor 10*a*.

Transmission line network 30 is similar to that of transmission line network 20. A bias resistor 32*a* is made of lightly doped polycrystalline semiconductor material deposited on a substrate, similar to resistor 24*a*. A power supply is connected to collector 11*a* through bias resistor 32*a* and line 31*a*. *Capacitor 33a* serves as a short circuit termination for line 31*a*, which is less than one quarter wavelength long, and therefore appears inductive as desired. Similarly, line 35*a* is terminated in an open circuit and is also less than one quarter wavelength long, thereby appearing capacitive. Line 34*a* has been broadened in its center section to make it appear capacitive as desired. Network 30 matches the output impedance of transistor 10 to an external load (not shown) so that an input signal applied to point 26*a* causes an output signal to appear at point 36*a*.

Although lines of a specific length have been described in this embodiment, it should be noted that any length lines fabricated using polycrystalline semiconductor material still fall within the scope of the invention.

Transmission lines of the types described in the foregoing and having a predetermined loss or attenuation characteristic can be readily fabricated using the above technique. Use of doped polycrystalline material having a predetermined resistivity permits precise control of the loss factor of a transmission line fabricated in accordance with the invention, thereby providing more accurate realization of a synthesized network in which the line is employed. In the case of polycrystalline silicon, the resistivity thereof varies accordingly with the addition of impurities, such as, for example, arsenic, phosphorus and boron. It is possible to control the resistivity of the polycrystalline silicon to values ranging from approximately $10^6$ ohm-cm for undoped material to 0.01 ohm-cm for heavily doped material. This fabrication technique minimizes production time by eliminating the need for multi-metal film conductors which require a multiplicity of process steps to complete.

In summary, the techniques of the present invention provide a simple inexpensive and efficient way to provide distributed parameter circuit elements, such as transmission lines, having a predetermined loss or attenuation characteristic.

I claim:

1. A distributed parameter transmission line including in combination a layer of substrate material, a conductive strip deposited on said substrate, said conductive strip comprising polycrystalline semiconductor material with a first portion thereof having a resistivity of a first given value and a second portion thereof having a resistivity of a lower given value than said first given value to predeterminedly vary the attenuation of said second portion of the transmission line.

2. A distributed parameter circuit element as recited in claim 1 wherein said conductive strip comprises polycrystalline silicon.

3. A distributed parameter circuit element as recited in claim 1 wherein said polycrystalline semiconductor material includes a predetermined amount of impurities for altering the resistivity thereof accordingly.

* * * * *